(12) United States Patent
Mohapatra et al.

(10) Patent No.: US 10,749,032 B2
(45) Date of Patent: Aug. 18, 2020

(54) TECHNIQUES FOR FORMING TRANSISTORS INCLUDING GROUP III-V MATERIAL NANOWIRES USING SACRIFICIAL GROUP IV MATERIAL LAYERS

(71) Applicant: INTEL CORPORATION, Santa Clara, CA (US)

(72) Inventors: Chandra S. Mohapatra, Hillsboro, OR (US); Glenn A. Glass, Portland, OR (US); Anand S. Murthy, Portland, OR (US); Karthik Jambunathan, Hillsboro, OR (US); Willy Rachmady, Beaverton, OR (US); Gilbert Dewey, Beaverton, OR (US); Tahir Ghani, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 65 days.

(21) Appl. No.: 16/076,550

(22) PCT Filed: Mar. 11, 2016

(86) PCT No.: PCT/US2016/021952
§ 371 (c)(1),
(2) Date: Aug. 8, 2018

(87) PCT Pub. No.: WO2017/155540
PCT Pub. Date: Sep. 14, 2017

(65) Prior Publication Data
US 2019/0043993 A1 Feb. 7, 2019

(51) Int. Cl.
*H01L 29/423* (2006.01)
*H01L 29/66* (2006.01)
(Continued)

(52) U.S. Cl.
CPC ........ *H01L 29/78609* (2013.01); *B82Y 10/00* (2013.01); *H01L 21/02524* (2013.01);
(Continued)

(58) Field of Classification Search
CPC ........ H01L 29/42392; H01L 29/41791; H01L 29/66545; H01L 29/66795; H01L 29/66856; H01L 29/66878
See application file for complete search history.

(56) References Cited

U.S. PATENT DOCUMENTS

2015/0028389 A1* 1/2015 Chen ................... H01L 29/7855
257/192
2015/0060997 A1 3/2015 Basu et al.
(Continued)

FOREIGN PATENT DOCUMENTS

WO 2017/155540 9/2017

OTHER PUBLICATIONS

International Preliminary Report on Patentability received for PCT Application No. PCT/US2016/021952. dated Sep. 11, 2018. 9 pages.
(Continued)

*Primary Examiner* — Phat X Cao
(74) *Attorney, Agent, or Firm* — Finch & Maloney PLLC

(57) ABSTRACT

Techniques are disclosed for forming transistors including one or more group III-V semiconductor material nanowires using sacrificial group IV semiconductor material layers. In some cases, the transistors may include a gate-all-around (GAA) configuration. In some cases, the techniques may include forming a replacement fin stack that includes group III-V material layer (such as indium gallium arsenide, indium arsenide, or indium antimonide) formed on a group IV material buffer layer (such as silicon, germanium, or silicon germanium), such that the group IV buffer layer can
(Continued)

be later removed using a selective etch process to leave the group III-V material for use as a nanowire in a transistor channel. In some such cases, the group III-V material layer may be grown pseudomorphically to the underlying group IV material, so as to not form misfit dislocations. The techniques may be used to form transistors including any number of nanowires.

20 Claims, 9 Drawing Sheets

(51) Int. Cl.
      *H01L 29/417* (2006.01)
      *H01L 29/786* (2006.01)
      *H01L 21/02* (2006.01)
      *H01L 29/06* (2006.01)
      *H01L 29/10* (2006.01)
      *H01L 29/775* (2006.01)
      *B82Y 10/00* (2011.01)
      *H01L 21/306* (2006.01)
      *H01L 21/762* (2006.01)
      *H01L 21/8252* (2006.01)
      *H01L 27/092* (2006.01)
      *H01L 29/20* (2006.01)

(52) U.S. Cl.
    CPC .. *H01L 21/02538* (2013.01); *H01L 21/02603* (2013.01); *H01L 21/30604* (2013.01); *H01L 21/76224* (2013.01); *H01L 21/8252* (2013.01); *H01L 27/092* (2013.01); *H01L 29/0649* (2013.01); *H01L 29/0673* (2013.01); *H01L 29/1079* (2013.01); *H01L 29/41791* (2013.01); *H01L 29/42392* (2013.01); *H01L 29/66469* (2013.01); *H01L 29/66522* (2013.01); *H01L 29/66545* (2013.01); *H01L 29/66742* (2013.01); *H01L 29/66977* (2013.01); *H01L 29/775* (2013.01); *H01L 29/78618* (2013.01); *H01L 29/78681* (2013.01); *H01L 29/78696* (2013.01); *H01L 21/02639* (2013.01); *H01L 29/20* (2013.01)

(56) References Cited

U.S. PATENT DOCUMENTS

| | | |
|---|---|---|
| 2015/0084041 A1 | 3/2015 | Hur et al. |
| 2015/0090958 A1 | 4/2015 | Yang et al. |
| 2015/0162403 A1 | 6/2015 | Oxland |
| 2015/0228772 A1 | 8/2015 | Glass et al. |
| 2017/0140996 A1* | 5/2017 | Lin ................ H01L 29/42392 |
| 2017/0141112 A1* | 5/2017 | Ching ............... H01L 27/0924 |

OTHER PUBLICATIONS

International Search Report and Written Opinion received for PCT Application No. PCT/US2016/021952. dated Nov. 21, 2016. 13 pages.

* cited by examiner

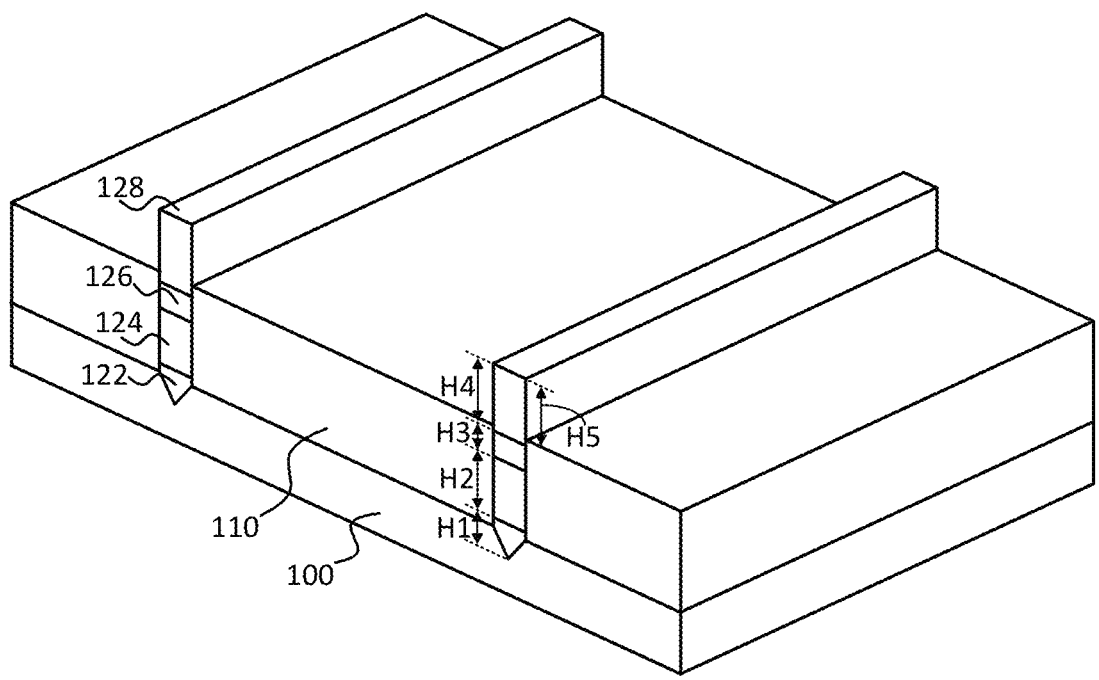
FIG. 1E
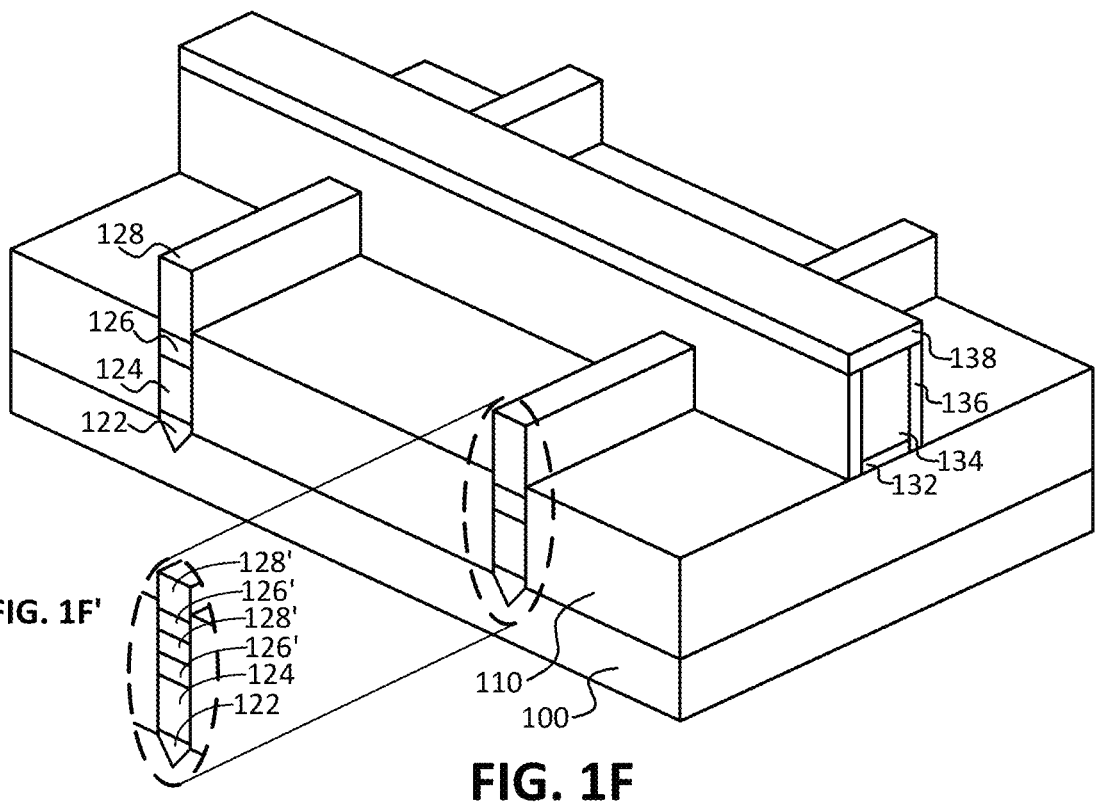
FIG. 1F'
FIG. 1F

TECHNIQUES FOR FORMING TRANSISTORS INCLUDING GROUP III-V MATERIAL NANOWIRES USING SACRIFICIAL GROUP IV MATERIAL LAYERS

BACKGROUND

Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. Some FETs have a fourth terminal called, the body or substrate, which can be used to bias the transistor. A metal-oxide-semiconductor FET (MOSFET) is configured with an insulator between the gate and the body of the transistor, and MOSFETs are commonly used for amplifying or switching electronic signals. In some cases, MOSFETs include side-wall or so-called gate spacers on either side of the gate that can help determine the channel length and can help with replacement gate processes, for example. Complementary MOS (CMOS) structures typically use a combination of p-type MOSFETs (p-MOS) and n-type MOSFETs (n-MOS) to implement logic gates and other digital circuits.

A finFET is a transistor built around a thin strip of semiconductor material (generally referred to as a fin). The transistor includes the standard FET nodes, including a gate, a gate dielectric, a source region, and a drain region. The conductive channel of the device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. Tri-gate transistors are one example of non-planar transistor configurations, and other types of non-planar configurations are also available, such as so-called double-gate transistor configurations, in which the conductive channel principally resides only along the two sidewalls of the fin (and not along the top of the fin). Another non-planar transistor configuration is a gate-all-around configuration, which is configured similarly to a fin-based transistor, but instead of a finned channel region where the gate is on three portions (and thus, there are three effective gates), one or more nanowires (or nanoribbons) are used and the gate material generally surrounds each nanowire.

BRIEF DESCRIPTION OF THE DRAWINGS

FIGS. 1A-L' illustrate example integrated circuit structures resulting from a method configured to form transistors including at least one group III-V semiconductor material nanowire channel, in accordance with some embodiments of this disclosure. Note that FIGS. 1I-L are cross-sectional views taken along plane A of FIG. 1H, in accordance with some embodiments. Also note that FIGS. 1C' and 1C" illustrate example alternative trench bottom shapes that may be formed, in accordance with some embodiments. Further note that FIGS. 1D', 1F', 1J', 1K', and 1L' are provided to illustrate example structures that may be used to form a transistor including two group III-V semiconductor material nanowires, in accordance with some embodiments.

Figure 1A:
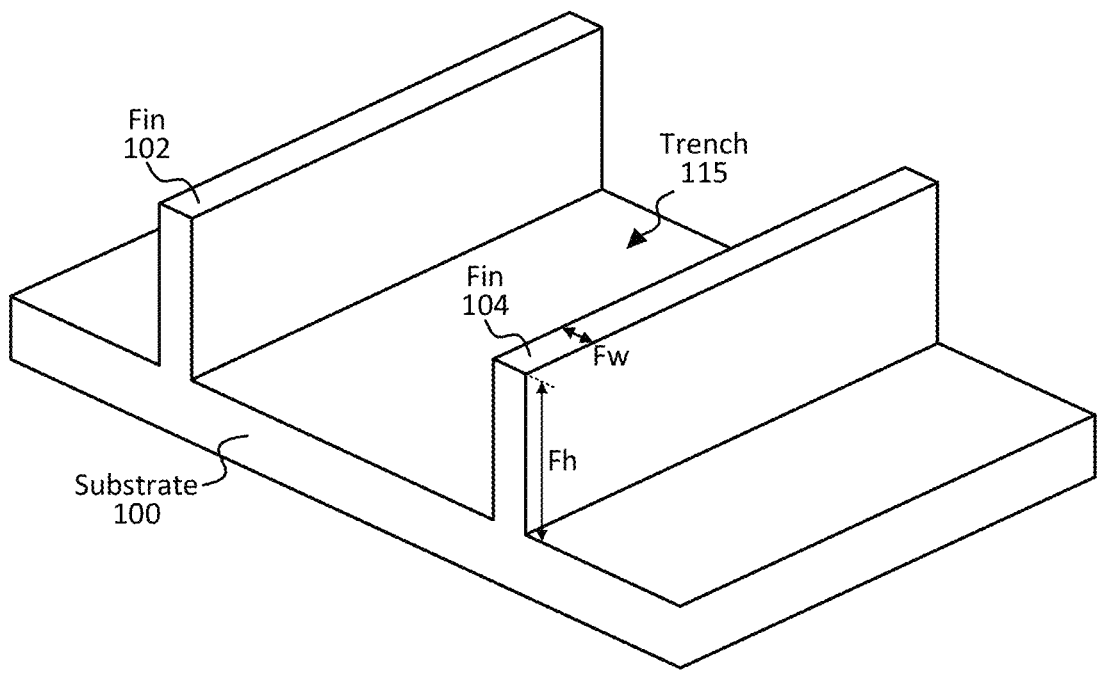

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming transistor structures including one or more group III-V semiconductor material nanowires using sacrificial group IV semiconductor material. In some cases, the transistors may include a gate-all-around (GAA) configuration and the structures may be formed using a GAA fabrication process. In some cases, the techniques may include forming a replacement fin stack that includes a group III-V material layer (such as indium gallium arsenide, indium arsenide, or indium antimonide) formed on a group IV buffer layer (such as silicon, germanium, or silicon germanium), such that the group IV buffer layer can be later removed using a selective etch process to leave the group III-V material for use as a nanowire in a transistor channel. In some such cases, the group III-V material layer may be grown pseudomorphically to the underlying group IV material, such that it conforms to the underlying group IV material without forming misfit dislocations. In some cases, a sacrificial group IV material cap layer may also be formed above the group III-V material layer to, for example, help protect the group III-V material layer (as it is targeted for use in a transistor channel). Further, in cases targeted to form more than one group III-V material nanowire, a sacrificial group IV cap layer may be formed above each group III-V layer to achieve a structure including two or more nanowires. Numerous configurations and variations will be apparent in light of this disclosure.

General Overview

Controlling source to drain leakage through the sub-fin or sub-channel region of a transistor without degrading transistor performance is a major challenge. This is particularly challenging for transistors including group III-V semiconductor materials. Techniques to address sub-fin or sub-channel leakage include forming transistors with a gate-all-around (GAA) configuration, where the transistor includes one or more nanowires (or nanoribbons) in the channel region. However, techniques for forming group III-V semiconductor material transistors having a GAA configuration can be difficult, due to the cleanliness or surface quality of the channel interface affecting the sub-threshold slope of the transistor characteristics, for example, as well as various other non-trivial issues.

Thus, and in accordance with one or more embodiments of the present disclosure, techniques are provided for forming transistor structures including one or more group III-V material nanowires using sacrificial group IV material. The use of "group IV material" herein includes at least one group IV element (e.g., silicon, germanium, carbon, tin, lead), such as Si, Ge, silicon germanium (SiGe), silicon carbide (SiC), and so forth. The use of "group III-V material" herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and so forth. In some embodiments, the techniques may include forming a replacement fin stack that includes a group III-V material layer on a group IV buffer layer, such that the group IV buffer layer can be later removed using a selective etch process to leave the group III-V material for use as a nanowire in a transistor channel. In some such embodiments, the group III-V material layer may be grown pseudomorphically to the underlying group IV material. In other words, in some such embodiments, the group III-V channel material could be grown thin enough (e.g., less than the critical thickness beyond which dislocations are introduced) such that it conforms to the underlying group IV (sub-fin) material without forming misfit dislocations. As a result, in some such embodiments, the channel material may remain strained to the group IV buffer layer (sacrificial material) which could accommodate the misfit strain. Moreover, in some such embodiments, because of the pseudomorphic epi growth, the lattice mismatch between the group III-V channel material and the group IV sub-fin materials may be inconsequential, enabling the growth of group III-V active channel layers on group IV material.

In some embodiments, the transistors may include a gate-all-around (GAA) configuration and the structures may be formed using a GAA fabrication process, as will be apparent in light of the present disclosure. In some embodiments, a sacrificial group IV material cap layer may also be formed above the group III-V material layer to, for example, help protect the group III-V material layer (as it is targeted for use in a transistor channel). Further, in some embodiments targeted to form more than one group III-V material nanowire, a sacrificial group IV material cap layer may be formed above each group III-V layer to achieve a structure including two or more nanowires. In some embodiments, a group IV material nucleation layer may be formed under the group IV buffer layer to, for example, wet the bottom of the fin trench and/or act as seeding material. In some embodiments, the replacement fin hetero-epitaxial stack (e.g., including sub-fin or sub-channel material and channel material) can be grown in-situ such that the adverse effects of air-break/planarization can be minimized or eliminated, for example. In some such embodiments, a cleaner (e.g., better surface quality) channel interface may result in improved sub-threshold slope of the transistor characteristics.

Numerous benefits will be apparent in light of this disclosure. For example, in some embodiments, the techniques reduce or completely eliminate source/drain leakage via sub-fin (or sub-channel). Further, in some embodiments, the use of a GAA transistor configuration may increase effective gate control, which can help curb leakage via short channel effects (e.g., especially in the context of III-V material channel). In some embodiments, the techniques are beneficial due to the good etch selectivity between group IV and group III-V materials. In other words, in some such embodiments, etchants are available (e.g., etchants including peroxide chemistry) that can selectively remove group IV materials (such as Ge) at a faster rate (e.g., at least 1.5-1000 times faster) than the removal of group III-V materials (and in some cases, the removal of III-V material using such etchants may not occur at all or may be trivial, for example). In some embodiments, the techniques described herein may be used in a CMOS integration scheme that includes group IV materials (such as Ge) and group III-V materials in the same epitaxial material stack. In some embodiments, the techniques described herein may lead to better short channel control, higher performance, and no (or minimal) off-state leakage. In some embodiments, the in-situ growth of the group III-V channel material on group IV sub-fin material may help to get better subthreshold slope compared to, for example, a recess and regrowth approach. In some embodiments, the techniques described herein may allow advancements to future/lower technology nodes as a result of, for example, shorter-channel transistor devices.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging or tomography, local electrode atom probe (LEAP) techniques, 3D tomography, high resolution physical or chemical analysis, to name a few suitable example analytical tools. In particular, in some embodiments, such tools may indicate a structure or device configured with at least one group III-V material nanowire, and such at least one nanowire may be located in the channel region of a transistor. In some such embodiments, the transistor may include a GAA configuration, such that the gate stack material substantially wraps around the at least one nanowire (e.g., wraps around at least 50, 60, 70, 80, 90, or 95% of the outer surface of the nanowire). In some embodiments, the techniques may form a transistor including a channel region including at least one nanowire, where the at least one nanowire is formed above the substrate. Further, in some such embodiments, a trench-like feature may be formed in the substrate and located below the at least one nanowire, and the gate stack material (e.g., gate dielectric and gate electrode) may extend into the trench-like feature in the substrate, as will be apparent in light of the present disclosure. In some embodiments, the techniques may leave remnants of the replacement fin structures used to form group III-V material nanowires, and such remnants may be located on the same substrate/die/chip. In some such embodiments, the remnants may include a finned structure formed on, in and/or above the shared substrate/die/chip (shared with a transistor formed using the techniques described herein), where the finned structure still includes one or more sacrificial group IV material layers, such as a buffer layer, a cap layer, and/or a nucleation layer, as described herein. In some embodiments, integrated circuit structures may be detected by measuring the benefits achieved from using the techniques described herein, such as the short-channel transistor performance improvement and/or the elimination (or reduction) of off-state leakage current, for example. Numerous configurations and variations will be apparent in light of this disclosure.

Methodology and Architecture

FIGS. 1A-L' illustrate example integrated circuit structures resulting from a method configured to form transistors including at least one group III-V semiconductor material nanowire channel, in accordance with some embodiments of this disclosure. Accordingly, in some such embodiments, the transistors may have a gate-all-around configuration, for example. Note that FIGS. 1I-L are cross-sectional views taken along plane A of FIG. 1H, in accordance with some embodiments. Also note that FIGS. 1C' and 1C" illustrate example alternative trench bottom shapes that may be formed, in accordance with some embodiments. Further note that FIGS. 1D', 1F', 1J', 1K', and 1L' are provided to illustrate example structures that may be used to form a transistor including two group III-V semiconductor material nanowires, in accordance with some embodiments. In some embodiments, the techniques can be used to form p-type and/or n-type transistor devices, such as p-type MOSFET (p-MOS), n-type MOSFET (n-MOS), p-type tunnel FET (p-TFET), or n-type TFET (n-TFET). Further, in some embodiments, the techniques may be used to benefit either or both of p-type and n-type transistors included in complementary MOS (CMOS) or complementary TFET (CTFET) devices, for example. Further yet, in some embodiments, the techniques may be used with devices of varying scales, such as transistor devices having critical dimensions in the micrometer range or in the nanometer range (e.g., transistors formed at the 32, 22, 14, 10, 7, or 5 nm process nodes, or beyond).

FIG. 1A illustrates an example structure including substrate 100 having fins 102 and 104 formed therefrom, in accordance with an embodiment. In some embodiments, fins 102 and 104 may be formed using any suitable techniques, such as one or more patterning and etching processes, for example. In some cases, the process of forming fins 102 and 104 may be referred to as shallow trench recess, for example. In this example embodiment, fins 102 and 104 are formed from substrate 100, but in other embodiments, fins may be formed on substrate 100 (e.g., using any suitable deposition/growth and patterning techniques). FIG. 1A also shows trench 115 formed between fins 102 and 104, in this example embodiment. In some embodiments, the fins may be formed to have varying widths Fw and heights Fh. For example, in an aspect ratio trapping (ART) scheme, the fins may be formed to have particular height to width ratios such that when they are later removed or recessed, the resulting trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects. In such an example case, the height to width ratio (h:w) of the fins may be greater than 1, such as greater than 1.5, 2, or 3, or any other suitable minimum ratio, for example. Note that although only two fins are shown in the example structure of FIG. 1A for illustrative purposes, any number of fins may be formed, such as one, five, ten, hundreds, thousands, millions, and so forth, depending on the end use or target application.

In some embodiments, substrate 100 may include: a bulk substrate including a group IV material or compound, such as silicon (Si), germanium (Ge), silicon carbide (SiC), or silicon germanium (SiGe) and/or at least one group III-V compound and/or sapphire and/or any other suitable material(s) depending on the end use or target application; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Recall that the use of group IV material herein includes at least one group IV element (e.g., silicon, germanium, carbon, tin, lead), such as Si, Ge, SiGe, SiC, and so forth. Also recall that the use of group III-V material as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and so forth. The original thickness or height of substrate 100 may be in the range of 50 to 950 microns, for example, or some other suitable thickness or height, and such original height may be reduced as a result of processing in, on and/or above the substrate 100. In some embodiments, substrate 100 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the transistor structures described herein may be included in a system-on-chip (SoC) application, as will be apparent in light of this disclosure.

Figure 1B:
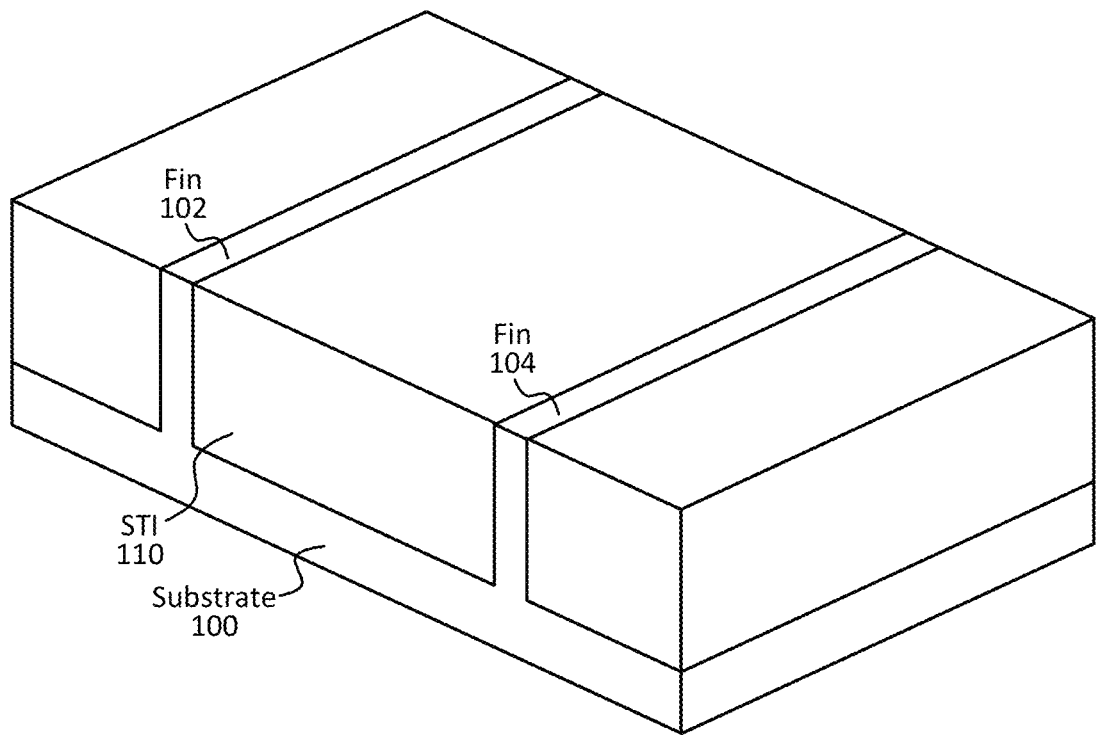

FIG. 1B illustrates an example structure formed after shallow trench isolation (STI) 110 processing has been performed in trenches 115 of the structure of FIG. 1A, in accordance with an embodiment. In some embodiments, STI processing may include any suitable techniques, such as deposition of the STI material followed by an optional planarization or polish process, for example. Any suitable deposition process may be used for the STI 110 deposition and the STI material may be selected based on the material of substrate 100 (e.g., to provide appropriate isolation and/or passivation), in some embodiments. For example, in the case of a Si substrate 100, STI material 110 may selected to be silicon dioxide or silicon nitride.

Figure 1C:
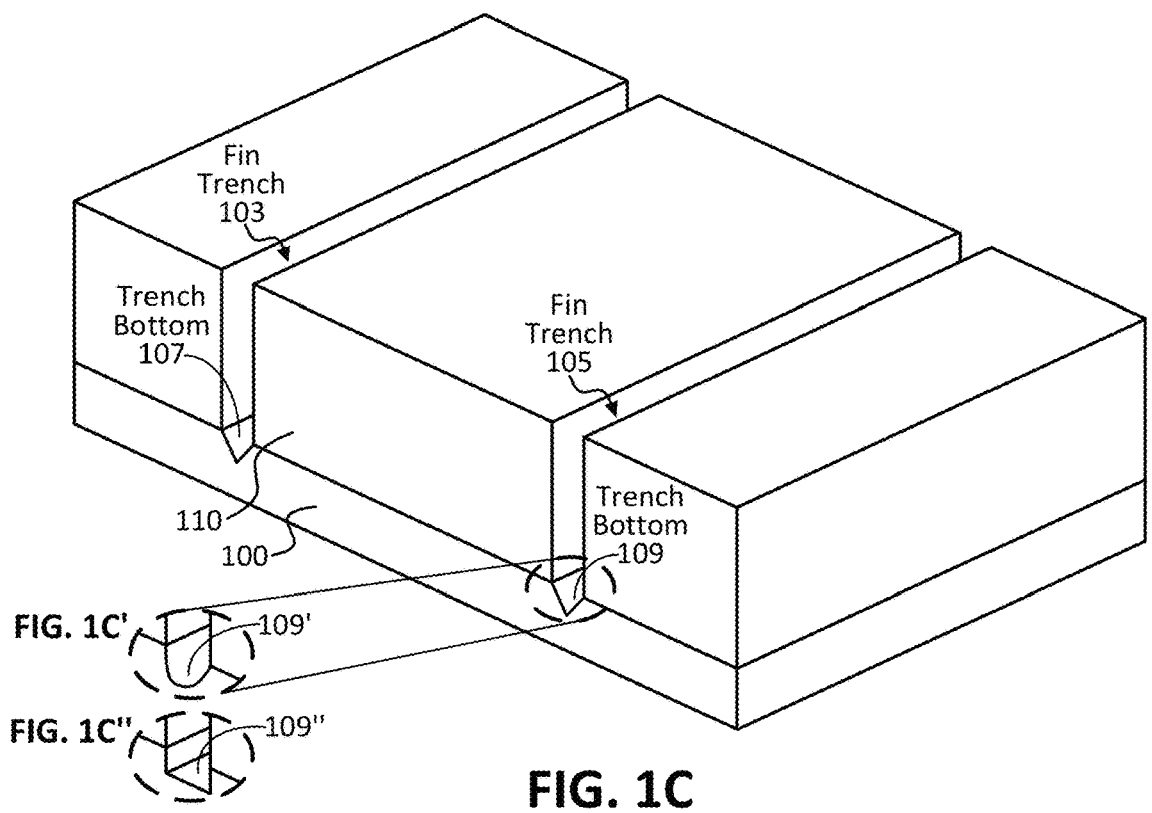

FIG. 1C illustrates an example structure formed after fins 102 and 104 have been etched out from the structure of FIG. 1B to form fin trenches 103 and 105, respectively, in accordance with an embodiment. In some embodiments, any suitable wet and/or dry etch processes may be used to form fin trenches 103 and 105, for example. In some such embodiments, the fin trenches 103 and 105 can include a desired or controlled size and shape, based on the size and shape of fins 102 and 104 and/or based on the conditions used during the etch to form trenches 103 and 105, for example. In the example structure of FIG. 1C, the bottom of the trenches 107 and 109 include faceting as shown, which can facilitate growth of subsequently deposited materials, as will be described in more detail herein. In this example embodiment, the faceting at the bottom of trenches 107 and 109 is shown as a {111} faceting, which includes a triangular shape at the bottom of the trench. In such an embodiment, the {111} faceting at the bottom of the trench may be used to facilitate the growth of the group III-V epitaxial materials, as will be described in more detail below. In some embodiments, any trench bottom geometry may be formed, such as a curved faceting 109' illustrated in FIG. 1C' or a flat bottom 109" illustrated in FIG. 1C", for example. In some embodiments, the geometry at trench bottoms 107 and 109 may be based on desired processing and/or real-world fabrication processes, for example.

Figure 1D:
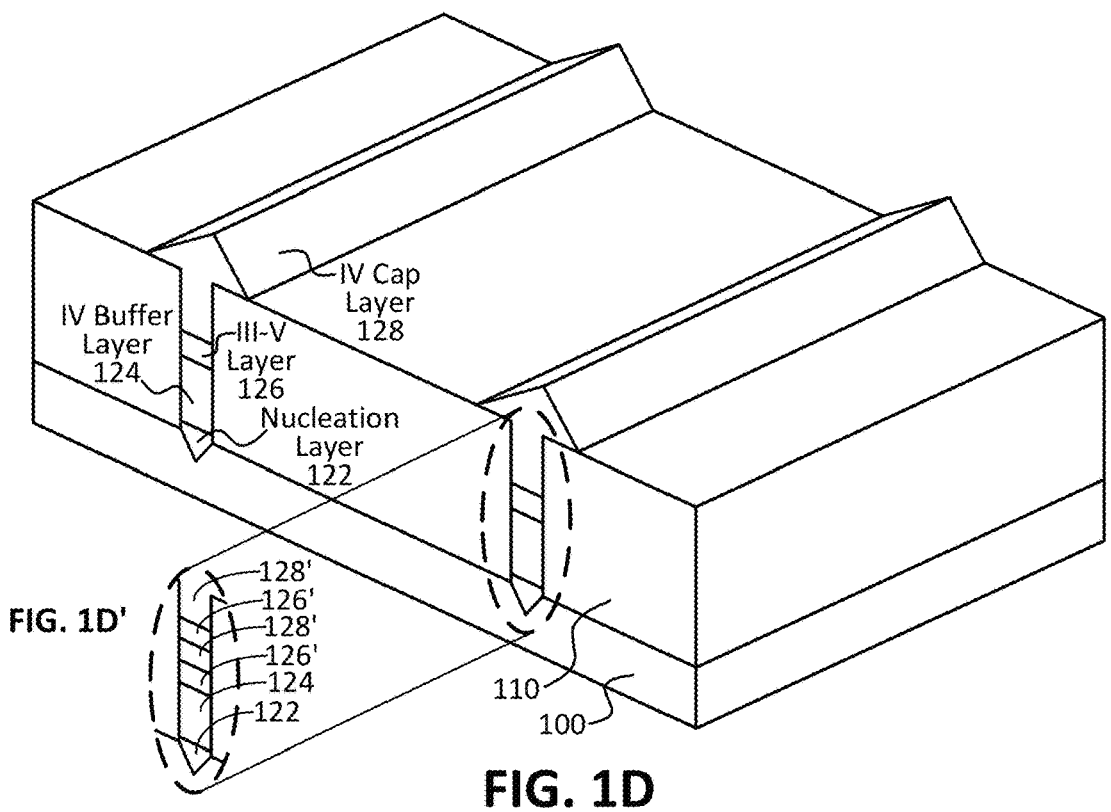

FIG. 1D illustrates an example structure formed after multiple materials have been deposited in fin trenches 103 and 105 of the structure of FIG. 1C, in accordance with an embodiment. In some embodiments, two or more material layers may be deposited in fin trenches 103 and 105. In some such embodiments, fin trenches 103 and 105 may be sufficiently narrow and/or sufficiently deep (e.g., with a height:width ratio of at least 2) for the deposition or epitaxial growth of the multi-layer structure to employ an ART scheme and to contain lattice defects (e.g., misfit dislocations, stacking faults, and so forth) to the very bottom of the trench. In some such embodiments, the use of narrow trenches 103 and 105 to employ an ART scheme can account for the lattice mismatch of the materials deposited therein. Further, in some such embodiments, employing an ART scheme minimizes or eliminates the lattice defects in the channel region, as can be understood based on this disclosure. In some embodiments, the deposition may be selective, such that it only or primarily (e.g., where at least 60, 70, 80, 90, or 95% of the material) grows in fin trenches 103 and 105, for example. In some such embodiments, some of the material may grow in other areas, such as on STI 110, for example. In this example embodiment, the materials deposited in fin trenches 103 and 105 include nucleation layer 122, group IV buffer layer 124, group III-V material layer 126, and group IV cap layer 128. Note that the use of group IV or group III-V to describe the material of a layer, feature, or structure is used to indicate that the layer, feature, or structure includes the corresponding group IV or group III-V material, but may also include other materials, such as one or more dopant materials, as will be apparent in light of the present disclosure. In some embodiments, nucleation layer 122 is optional (and thus, not present), as it may be deposited to wet the trench bottoms 103 and 105 (e.g., to wet the {111} faceted trenches), for example. In embodiments where nucleation layer 122 is present, it may include a group IV material, such as Si, Ge, or SiGe, for example. In some embodiments, nucleation layer 122, where present, may include material based on the material of substrate and/or the overlying layer (e.g., group IV buffer layer 124).

In the example embodiment of FIG. 1D, group IV buffer layer 124 is deposited or grown on nucleation layer 122. In embodiments where nucleation layer is not included, buffer layer 124 may be deposited or epitaxially grown directly on the bottom of fin trenches 103 and 105, for example. In some embodiments, buffer layer 124 may include a group IV material, such as Si, Ge, or SiGe, for example. In some embodiments, the group III-V material layer 126 may be deposited/epitaxially grown above and/or on group IV buffer layer 124, and layer 126 may be used for a transistor channel, as will be described in more detail herein. In some such embodiments, the epitaxial growth of layer 126 may be performed in situ (without air break), which may help to provide a better subthreshold slope compared to, for example, a recess and regrowth technique. In some embodiments, group III-V material layer 126 may include indium gallium arsenide (InGaAs), gallium arsenide (GaAs), gallium nitride (GaN), indium gallium nitride (InGaN), indium arsenide (InAs), indium arsenide antimonide (InAsSb), or indium antimonide (InSb), just to name a few examples. In some embodiments, III-V material layer 126 may be a pseudomorphic layer or grown pseudomorphically to the buffer layer 124. In some such embodiments, III-V material layer 126 (to be used for the transistor channel) may be grown thin enough (e.g., less than the critical thickness beyond which dislocations are introduced) such that it conforms to the underlying buffer layer 124 without forming misfit dislocations, for example. Further, in some such embodiments, the III-V material layer may remain strained to the buffer layer 124 material, which may accommodate the misfit strain, for example. Moreover, in some such embodiments, because of the pseudomorphic epitaxial growth of the III-V material layer 126, the lattice mismatch between the III-V material layer 126 and the underlying IV buffer layer 124 may become inconsequential or have minimal to no impact. Therefore, in some embodiments, the group IV buffer layer 124 material and/or the group III-V layer 126 material may be selected to allow for pseudomorphic growth of layer 126, thereby enabling a device quality active channel layer 126.

In some embodiments, an optional group IV cap layer 128 may be deposited/epitaxially grown above and/or on the group III-V material layer 126. As can be seen in FIG. 1D, cap layer 128 is included and has been overgrown above the STI 110 plane of the structure. In some embodiments, cap layer 128 may include a group IV material, such as Si, Ge, or SiGe, for example. In some embodiments, cap layer 128 may include the same materials as buffer layer 124, while in other embodiments, the layers 124, 128 may include different materials. In some embodiments, the material of group IV buffer layer 124 (and group IV cap layer 128, where present) may be selected such that there it can be selectively removed relative to the material of III-V layer 126. In this manner, in some embodiments, the group IV material layers (e.g., 124, and where present, 122 and 128) may be sacrificial material used to help form the channel layer 126 into a nanowire as a result of selectively removing the group IV material layers using an etch process, as will be described in more detail below. In some embodiments, one or more of the layers included in the fin stack (e.g., one or more of layers 122, 124, 126, 128) may include grading (e.g., increasing and/or decreasing) the content of one or more materials in the layer. Further, in some embodiments, one or more of the layers included in the fin stack may be a multi-layer structure including at least two material layers, depending on the end use or target application.

In some embodiments, the stack of materials formed in fin trenches 103 and 105 may include one or more additional III-V material layers in the stack to, for example, form a GAA transistor configuration including at least two nanowires/nanoribbons. Further, in some such embodiments, sacrificial group IV material layers may be formed between the two or more III-V material layers to be later removed using a selective etch process. For example, FIG. 1D' illustrates an alternative stack of materials that may be formed in the fin trenches 103 and 105, in accordance with an embodiment. As can be seen, the stack includes nucleation layer 122 and buffer layer 124, as previously described, but also includes two layers of III-V material 126' and two group IV material cap layers 128'. The previous relevant disclosure with respect to layers 126 and 128 are equally applicable to layers 126' and 128', respectively. As can be understood based on the present disclosure, the two group IV material cap layers 128' may be subsequently removed via a selective etch process to release the two III-V material layers 126', for example, to form two nanowires in the channel region of a transistor, as will be described in more detail below. Numerous variations on the material stack will be apparent in light of the present disclosure, and any number of III-V material layers 126/126' may be used in the stack (e.g., 1, 2, 3, 4, 5, and so forth) to form a corresponding number of nanowires/nanoribbons (e.g., 1, 2, 3, 4, 5, and so forth) using the techniques described herein.

FIG. 1E illustrates an example structure formed after the STI 110 material of the structure of FIG. 1D has been recessed, in accordance with an embodiment. In some embodiments, recessing STI 110 material may be performed using any suitable techniques. In some such embodiments, a polish or planarization process may have been performed prior to recessing STI material 110. In this example embodiment, STI 110 material was recessed such that the group IV cap layer 128 is within the active fin height H5 (the height of the portion of the fin that is above the STI 110 plane); however, in other embodiments, the STI 110 material may be recessed to a different depth. For example, in some embodiments, the recess process may be performed to target the top of the STI plane 110 to be above the III-V layer 126, such that a portion of the cap layer 128 is sandwiched between STI material 110. In some embodiments, nucleation layer 122 may have a height H1 in the range of 10-50 nm (e.g., 15-30 nm), or any other suitable height, depending on the end use or target application. In some embodiments, group IV buffer layer 124 may have a height H2 in the range of 20-200 nm (e.g., 50-100 nm), or any other suitable height, depending on the end use or target application. In some embodiments, group III-V material layer 126 may have a height H3 in the range of 10-100 nm (e.g., 10-50 nm), or any other suitable height, depending on the end use or target application. In some embodiments, group IV cap layer 128 may have a height H4 in the range of 20-200 nm (e.g., 50-100 nm), or any other suitable height, depending on the end use or target application.

FIG. 1F illustrates an example structure formed after a dummy gate stack has been formed on the structure of FIG. 1E, in accordance with an embodiment. In this example embodiment, gate dielectric 132 and gate 134 are dummy materials (e.g., dummy poly-silicon for the gate 134) used for a replacement gate process in, for example, a gate last process flow. As will be discussed with reference to FIG. 1G, the dummy materials will be removed to allow for processing in the channel region of the structure to form one or more nanowires. Formation of the dummy gate stack may include depositing the dummy gate dielectric material 132, dummy gate electrode material 134, patterning the dummy gate stack, depositing gate spacer material 136, and performing a spacer etch to form the structure shown in FIG. 1F, for example. The example structure in this embodiment also includes hardmask 138 over the gate stack, which may be included to protect the dummy gate stack during subsequent processing, for example. FIG. 1F' is provided to illustrate the example alternative fin of FIG. 1D', at this stage in the process flow.

Figure 1G:
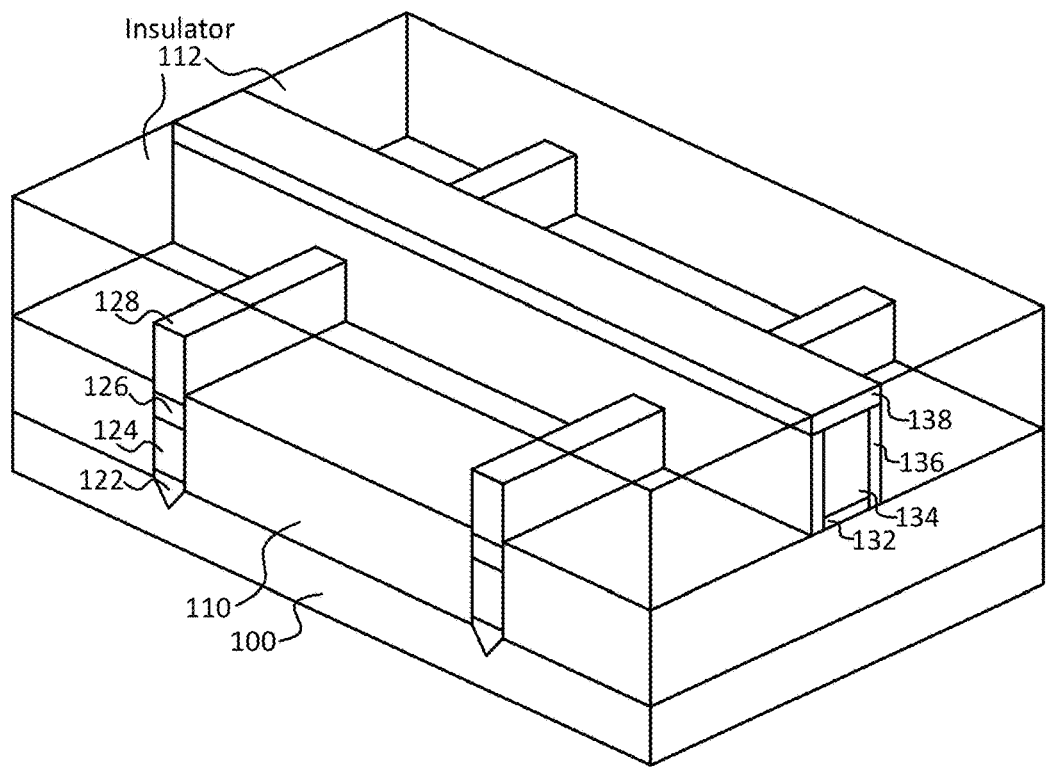

FIG. 1G illustrates an example structure formed after a layer of insulator material 112 has been formed on the structure of FIG. 1F, in accordance with an embodiment. Note that, in this example embodiment, insulator material 112 is illustrated as transparent to allow for underlying features to be seen. In some embodiments, the insulator material 112 may include a dielectric material, such as silicon dioxide, for example. In some embodiments, following deposition of the insulator material 112, a polish and/or planarization process may be performed to produce the example structure of FIG. 1G.

Figure 1H:
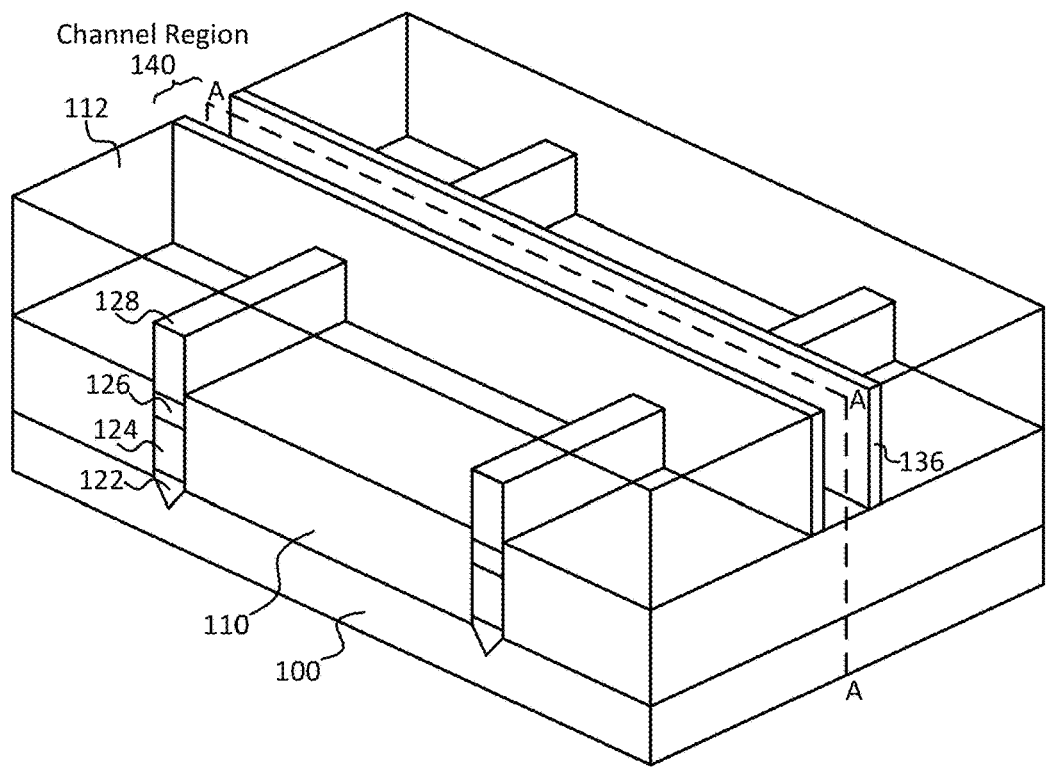

FIG. 1H illustrates an example structure formed after the dummy gate stack (including dummy gate dielectric 132 and dummy gate electrode 134) of FIG. 1G have been removed to re-expose the channel region 140, in accordance with an embodiment. In some embodiments, removing the dummy gate stack may include first removing hardmask layer 138 and then removing the dummy gate stack (layers 134 and 132, in this example case) using any suitable techniques, such as etches, polishes and/or cleaning processes, for example. The A plane in FIG. 1H is used to indicate the cross-sectional views of FIGS. 1I-K', as will be described in more detail below.

Figure 1I:
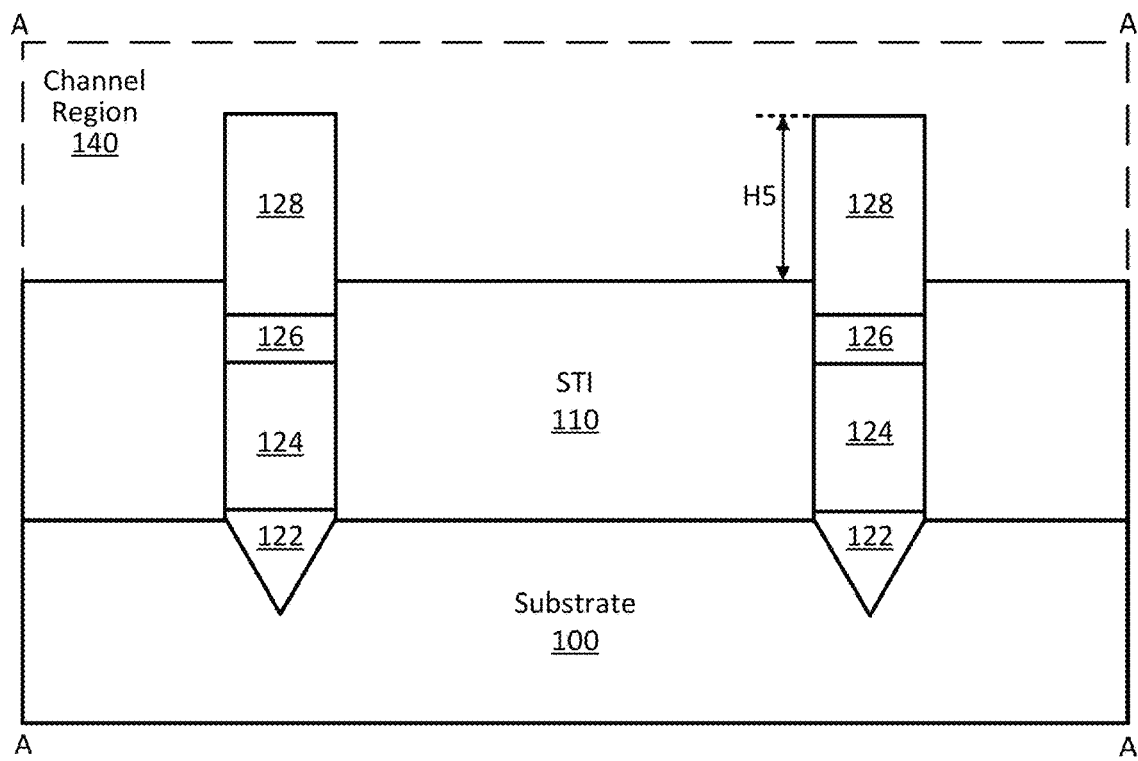

FIG. 1I is a cross-sectional view taken along plane A of FIG. 1H, in accordance with an embodiment. FIG. 1I is provided to illustrate the channel region of the structure of FIG. 1H. As can be seen, the structure includes a sub-fin portion that is below the top of the STI 110 plane and a portion above the top of the STI plane, which has a height H5 as indicated, in this example embodiment. Recall that in this example embodiment, the group IV material layers (layers 122, 124, and 128) are intended to be sacrificial layers to be etched out and removed to form one or more nanowires, as will be described in more detail below. Also recall that nucleation layer 122 and cap layer 128 are optional layers, and thus in some embodiments, one or both of the layers need not be present. In some embodiments, maintaining a portion of the replacement fin material (such as the portion to be used as the transistor channel region, which is layer 126 in this example embodiment) below the top of the STI 110 plane can help in keeping the interfaces of that sub-STI plane portion clean (e.g., better surface quality) until the sub-fin or sub-channel material is actually released, for example. In this example embodiment, the pseudomorphic III-V material layer 126, which is targeted to be used as the transistor channel, is protected as it is sandwiched between the group IV buffer layer 124 and cap layer 128, and also sandwiched between the STI 110 material.

Figure 1J:
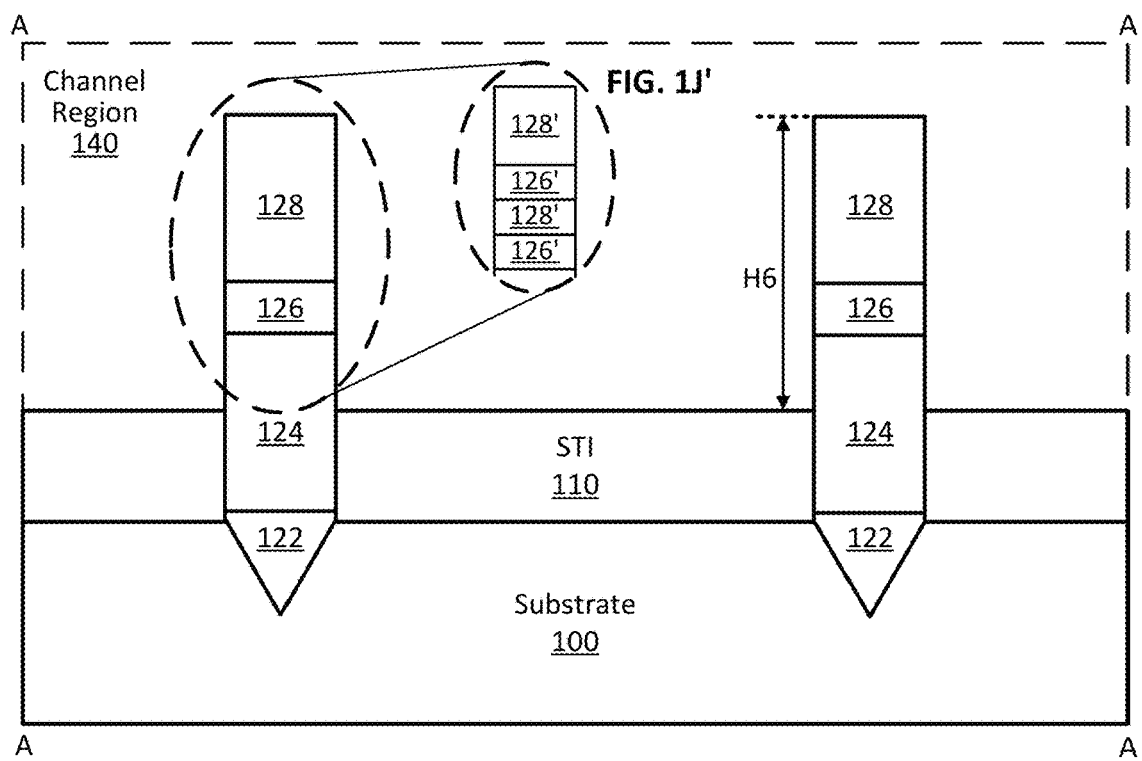
Figure 1K:
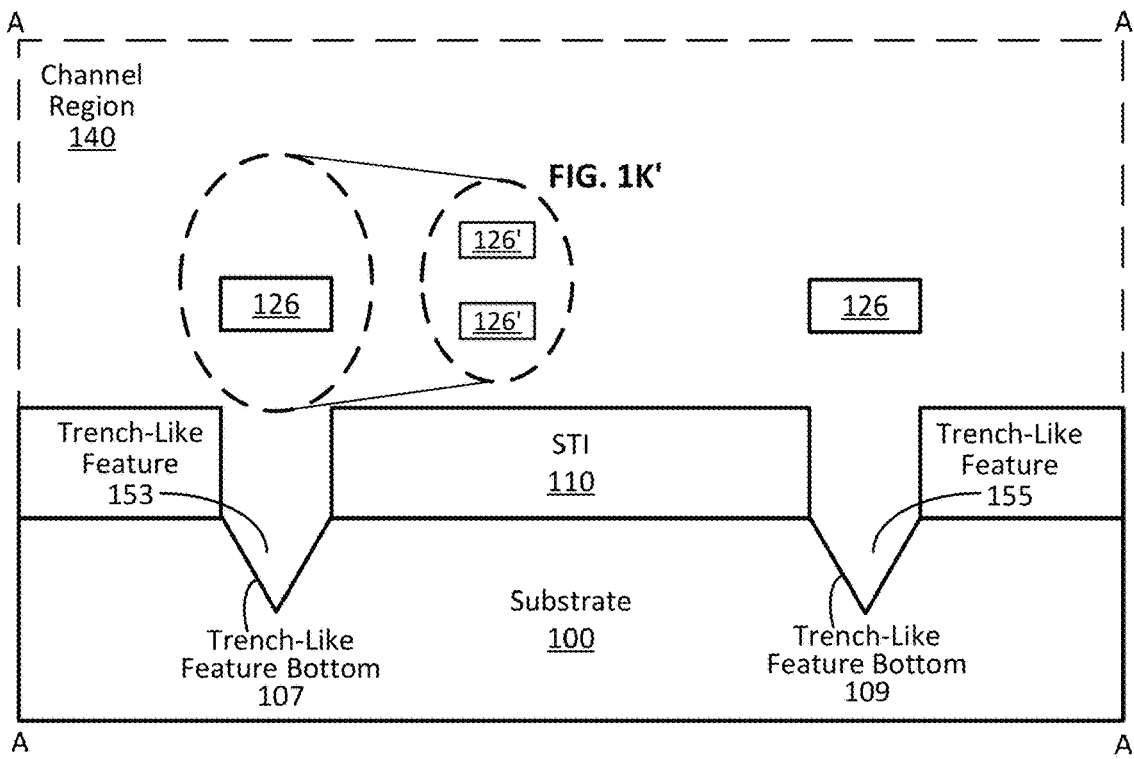

FIG. 1J illustrates an example structure after the STI 110 of FIG. 1I is recessed such that a portion of the previous sub-fin region is exposed, in accordance with an embodiment. This enables a selective etch (e.g., wet and/or dry) to be performed and form the example structure of FIG. 1K, in accordance with an embodiment. In some embodiments, the selective etch may include an etch process that removes the group IV material (e.g., of layers 124, and where present, 122 and 128) at a rate of at least 1.5, 2, 3, 4, 5, 10, 100, or 1000 times faster relative to the removal of III-V material (e.g., of layer 126) for a given etchant. Note that in some embodiments, more than one etch process may be performed, for example. Also note that in some embodiments, the fin (having an active fin height H6) of FIG. 1J may be used in a finned transistor configuration, for example. In some such embodiments, any suitable etchant and/or etch conditions may be used to achieve the desired selectivity of the process. For example, a peroxide chemistry may be used to selectively etch and remove the group IV material layers (e.g., layers 128, 124, and 122) while minimally etching (or not etching at all) the III-V material layer 126. Example material combinations that may be used with the peroxide chemistry include Si, Ge and/or SiGe for the group IV material layers (e.g., layers 128, 124, and 122) and InGaAs, InAs, and/or InAsSb for the group III-V material layer (e.g., layer 126). As can be seen in FIG. 1K, the group IV material (e.g., layers 128, 124, and 122) has been selectively removed, leaving III-V material layer 126 which may be held in place by spacers 136 on either side of the layer 126, for example.

As can also be seen in FIG. 1K, trench-like features 153 and 155 are formed in the STI 110 and substrate 100 as a result of removal of the group IV material layers (e.g., as a result of the removal of layers 122 and 124, in this example embodiment). In this example embodiment, trench-like features 153 and 155 are formed below III-V material layer 126 (which is targeted to be used as the transistor channel) and in substrate 100, such that the bottoms 107 and 109 of trench-like features 153 and 155 extend below the STI material 110 and below the top/upper surface of substrate 100 (e.g., the surface at the interface of substrate 100 and STI material 110), as can be seen in FIG. 1K. Recall that the bottoms 107 and 109 of trench-like features 153 and 155 may have various different shapes (e.g., as shown in FIGS. 1C' and 1C"), depending on the etch process used to form fin trenches 103 and 105, for example. In addition, in some embodiments, the etch process used to remove the group IV material layers from the structure of FIG. 1J may also remove a portion of the substrate 100 material, as substrate 100 may also include, for example, group IV material (or other material that may be removed by the etchant used during the etch process). Therefore, in some such embodiments, the etch may remove some substrate material 100 at the bottoms 107 and 109 of trench-like features 153 and 155, and such trench-like features may thus take on a different shape than that formed for fin trenches 103 and 105. Note that in some embodiments, the etch process to remove the group IV material may not completely remove the group IV material in trench-like features 153 and 155, such that some remaining group IV material may remain in trench-like features 153 and 155, such as at the bottoms 107 and 109 of the trench-like features, for example. In other words, in some embodiments, the selective etch process may substantially remove the group IV material, such that a portion of the sacrificial material may remain in trench-like features 153, 155. In some such embodiments, substantially remove may include that, at most, sacrificial group IV material having a thickness of 50, 40, 30, 20, 10, 5, 2, or 1 nm remains, or some other suitable maximum thickness, depending on the selective etch process performed.

As can be understood based on this disclosure, FIG. 1K illustrates a gate-all-around (GAA) transistor configuration, where a single nanowire/nanoribbon 126 is formed. FIGS. 1J' and 1K' are provided to illustrate an embodiment including two nanowires/nanoribbons, which may be formed using the alternative replacement material fin stack illustrated in FIGS. 1D' and 1E', and described herein, for example. In such an example embodiment, when the group IV material layers are etched and removed to form the structure of FIG. 1K' (from the structure of FIG. 1J'), the process can also remove additional cap layers 128', thereby leaving the two nanowires/nanoribbons 126' suspended in place by spacers 136 on either side of the material 126'. In some embodiments, any number of nanowires/nanoribbons (e.g., 1, 2, 3, 4, 5, 6, and so forth) may be formed for the channel region of a GAA transistor, using the techniques described herein. In some embodiments, an interfacial layer may remain between two or more nanowires formed, such as layer 128' between layers 126' in FIG. 1J', in the final structure, and such an interfacial layer may include insulating material, for example, or any other suitable material, depending on the end use or target application. In some such embodiments, the gate stack material may substantially wrap around the two or more nanowires, as opposed to individually wrapping around each one, for example.

Figure 1L:
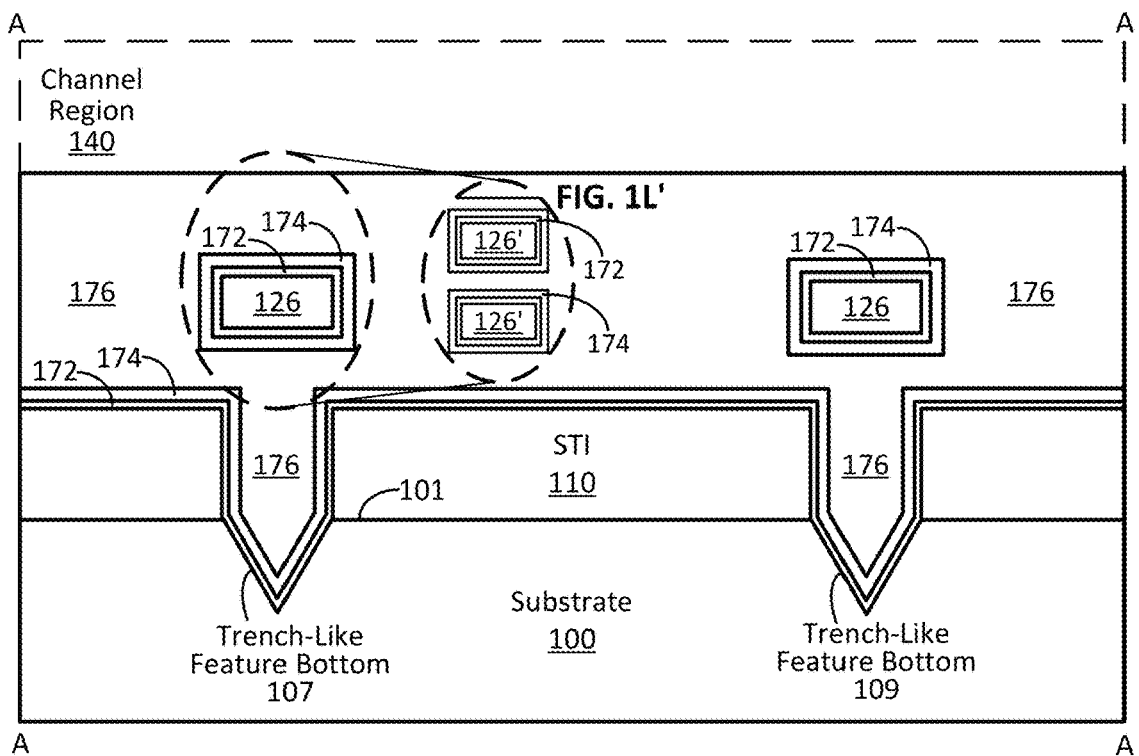

FIG. 1L illustrates an example structure after gate processing has been performed on the structure of FIG. 1K, in accordance with an embodiment. After the nanowires 126 have been fabricated and revealed, as shown in FIG. 1K, gate stack processing can follow, such as a replacement metal gate (RMG) process flow, for example. In this example embodiment, the gate stack processing includes depositing a thin (e.g., 1-20 nm in thickness) gate dielectric layer 172 around each nanowire 126. As can be seen in this example embodiment, the gate dielectric material 172 is conformally deposited, such that is has a substantially similar thickness on all surfaces upon which it grows and tracks with the topography of the surfaces upon which it grows. Further, as can be seen in the example structure of FIG. 1L, the thin gate dielectric material 172 also conformally grows on the base portion of the structure from FIG. 1K, such as on and over STI material 110 and the bottoms 107, 109 of trench-like features 153, 155 in substrate 100 (which used to be the sub-fin portion of the fin formed in FIGS. 1D-1E). In some embodiments, the gate dielectric material 172 may include silicon dioxide and/or a high-k dielectric material, depending on the end use or target application. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 172 to improve its quality when a high-k material is used, for example. In some embodiments, gate dielectric layer 172 may include a multi-layer structure of two or more material layers. In some embodiments, gate dielectric layer 172 may include grading (e.g., increasing and/or decreasing) the content of one or more materials in at least a portion of the gate dielectric layer 172.

Continuing with the structure of FIG. 1L, in this example embodiment, the gate processing includes depositing gate electrode material 174 (e.g., 10-100 nm in thickness) on the thin gate dielectric layer 172. As can be seen in this example embodiment, the gate electrode material 174 is conformally deposited, such that it has a substantially similar thickness over the gate dielectric material 172 and tracks with the topography of gate dielectric material 172 upon which the gate electrode material grows. Further, as can be seen in the example structure of FIG. 1L, gate electrode material 174 also conformally grows over the thin gate dielectric layer 172 on the base portion of the structure from FIG. 1K, such as over STI material 110 and in trench-like features 153, 155. In addition, in this example embodiment, the gate processing included depositing gate contact material 176 on the gate electrode material layer 174. As can be seen in the example structure of FIG. 1L, the gate contact material 176, in this embodiment, fills trench-like features 153, 155; however, in some embodiments, the gate contact material 176 need not completely fill one or more of the trench-like features 153, 155, as will be described in more detail with reference to FIG. 2. In some embodiments, the material of gate electrode 174 and gate contact 176 may include any suitable material, such as polysilicon, silicon nitride, silicon carbide, or various suitable metals or metal alloys, such as aluminum (Al), tungsten (W), titanium (Ti), tantalum (Ta), copper (Cu), niobium (Nb), titanium nitride (TiN), and/or tantalum nitride (TaN), to name some suitable materials. For example, in some embodiments, the gate electrode material 174 may be TiN and/or TaN and the gate contact material 176 may be W, Ta, or Nb. Note that in some embodiments, one of gate electrode 174 or gate contact 176 need not be present in the gate stack, such that only one other gate material layer is present and in contact with gate dielectric layer 172. Further note that in some embodiments, the gate stack may include additional material layers, such as one or more material layers between layers 172 and 174 and/or between layers 174 and 176. In some such embodiments, work-function material layers may be included to, for example, increase the interface quality between layers 172, 174, and/or 176 and/or to improve the electrical properties between layers 172, 174, and/or 176. FIG. 1L' is provided to illustrate gate dielectric 172 and gate electrode material 174 on the two nanowires 126' from FIG. 1K'.

Figure 2:
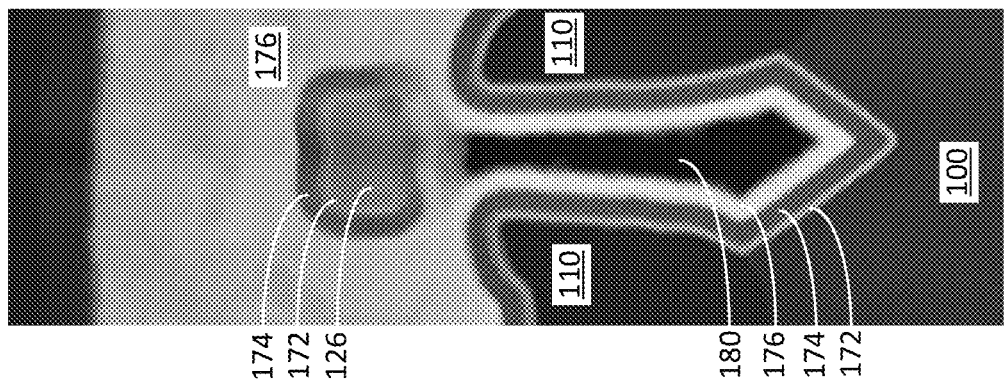
FIG. 2 is a scanning transmission electron microscope (STEM) image illustrating a portion of the example structure of FIG. 1L and including some variations, in accordance with an embodiment of the present disclosure. For example, one such variation is that a void is present between the nanowire and the substrate.

FIG. 2 is a scanning transmission electron microscope (STEM) image illustrating a portion of the example structure of FIG. 1L and including some variations, in accordance with an embodiment of the present disclosure. The image of FIG. 2 includes the same features as those in roughly one half of the structure of FIG. 1L, where both include substrate 100, STI material 110, nanowire 126, gate dielectric 172, gate electrode material 174, and gate contact material 176. However, the image of FIG. 2 also includes a void 180 below nanowire 126, located in what was the trench-like feature 153 of FIG. 1K. In other words, in the example embodiment shown in FIG. 2, when gate contact material 176 was deposited, the material only partially filled up the sub-fin, trench-like feature region 153 of FIG. 1K, leaving void 180 with no material. This can be contrasted with the example embodiment of FIG. 1L, where the entirety of the sub-fin, trench-like feature regions 153, 155 of FIG. 1K were completely filled with gate contact material 176. The image of FIG. 2 also illustrates other variations. For example, as can be seen in FIG. 1L, the features of the example structure are primarily illustrated using straight lines, aligned features, and so forth, for ease of depiction. However, in some instances, variations in topography, alignment, and other geometry of the structure may vary based on desired processing and/or as a result of real-world fabrication processes. For instance, as shown in FIG. 2, the topography is more-so rounded and curved in some areas, such as at the corners where the STI material 110 meets the gate stack materials 172, 174, and 176. Further, as illustrated in the example image of FIG. 2, nanowire 126 has a wavy and non-uniform outside surface. Further yet, the trench-like feature 153, 155 formed in substrate 100 may not be symmetrical or even substantially symmetrical as shown in FIG. 1L. For example, as can be seen in FIG. 2, the feature starts at a higher location on one side than the other side (with the left side being higher, in this example embodiment). Numerous structural variations and configurations will be apparent in light of the present disclosure.

Continuing with FIGS. 1L and 2, although the cross-sectional geometry of nanowires 126 are generally depicted as rectangular, in some embodiments, the nanowires may have different cross-sectional geometry. For example, in some embodiments, the nanowires formed using techniques described herein may have cross-sectional geometries more-so resembling a circle, semi-circle, ellipse, semi-ellipse, oval, semi-oval, square, parallelogram, rhombus, trapezoid, diamond, triangle, pentagon, hexagon, and so forth, regardless of orientation. Further still, as previously described, the bottom of trench-like feature may have varying different geometries, such as those illustrated in FIGS. 1C' and 1C", for example. In some embodiments, the gate stack materials may wrap at least substantially around each of the nanowires (e.g., around each single nanowire 126 or each double nanowires 126'), where the gate dielectric material 172 is between the gate electrode material 174 and the nanowire/nanoribbon material (e.g., the III-V material of layers 126/126'). In some such embodiments, at least substantially around may include being around at least 60, 70, 80, 90, or 95% of the outer surface of each nanowire/nanoribbon, or some other suitable minimum amount, depending on the end use or target application. In other words, in some embodiments, the gate stack material need not be completely around each transistor nanowire.

As shown in the embodiments of FIGS. 1L and 2, gate stack material is located in the bottom of the trench-like features 153 and 155 of FIG. 1K. More specifically, that gate stack material includes all of gate dielectric material 172, gate electrode material 174, and gate contact material 176. In other words, in some embodiments, at least one gate or gate stack material (e.g., gate dielectric material, gate material, gate contact material, and/or other material layers in the gate stack) may be located below a top or upper surface 101 of substrate 100 (indicated in FIG. 1L). Such top or upper surface of substrate is also the surface that is at the interface with STI material 110. Thus, gate stack material extends down and into substrate 100 during the gate stack formation process. In some embodiments, the gate stack material may extend into the trench-like feature 153, 155 in substrate 100 at least 10, 20, 50, 100, 150, or 200 nm, or some other suitable minimum amount, below the top or upper surface 101 of substrate 100, for example. Moreover, at least one gate stack material may be on and in physical contact with substrate 100 at the bottoms 107, 109 of trench-like features 153, 155. In this example embodiment, gate dielectric material 172 is on and in physical contact with substrate 100. Recall that, in some embodiments, the etch used to form the resulting example structure of FIG. 1K may not entirely remove the sub-fin sacrificial material (e.g., material from layer 122), such that the material is not entirely removed from the bottoms 107, 109 of the trench-like features 153, 155. In some such embodiments, the gate dielectric layer 172 may be formed on that remaining group IV material and may not be in direct physical contact with substrate 100. However, in some such embodiments gate stack material may still be located in the trench-like features 153, 155 formed in substrate 100.

Figure 3:
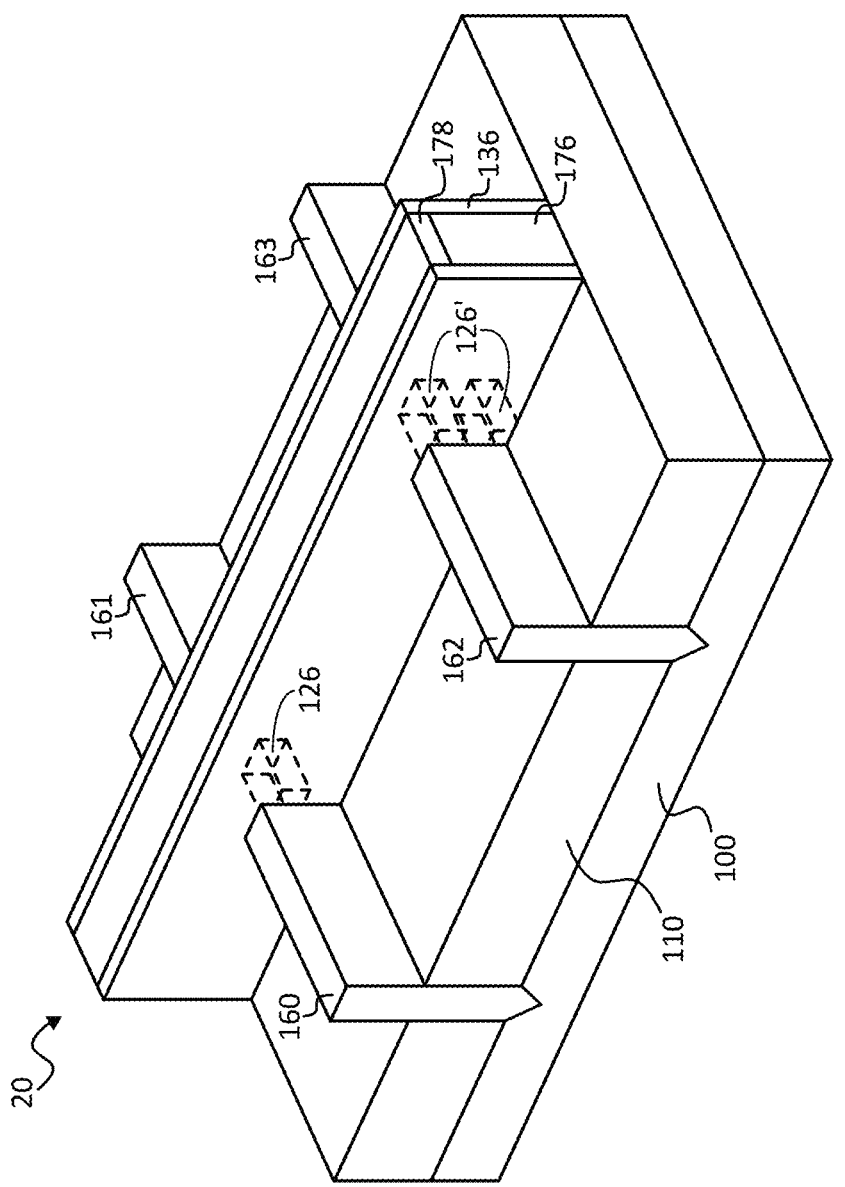
FIG. 3 illustrates an integrated circuit including gate-all-around transistor configurations including group III-V material nanowires, in accordance with some embodiments of this disclosure.

FIG. 3 illustrates an integrated circuit including gate-all-around transistor configurations including group III-V material nanowires, in accordance with some embodiments. As can be seen in the example structure of FIG. 3, the channel region 140 of FIG. 1H has been processed as described with reference to FIGS. 1I-L, in this example embodiment. In addition, hardmask 178 has been formed on the gate stack, in this example case, to protect the gate stack during other processing, such as during the source/drain processing that occurred to form source/drain regions 160/161 and 162/163. As shown in FIG. 3, source/drain regions 160/161 are adjacent to the GAA channel region 126 including one nanowire/nanoribbon (e.g., as shown in FIG. 1K) and source/drain regions 162/163 are adjacent to the GAA channel region 126' including two nanowires/nanoribbons (e.g., as shown in FIG. 1K'), to illustrate two example cases. Any number of additional processes may be performed to complete the formation of one or more transistor devices, such as forming source/drain contacts and performing back-end-of-line interconnections, for example. In some embodiments, the source/drain processing may include patterning and filling the source/drain regions with appropriately doped (or undoped, in some cases) epitaxial materials. In some embodiments, the source/drain epitaxial regions may be grown after performing an etch-under-cut (EUC) process. In some such embodiments, the source/drain regions may extend under spacers 136 and/or under the gate stack, and such extended portions may be referred to as source/drain tips or extensions, for example. In some embodiments, the source/drain regions may be formed completely in the substrate, may include a portion of the substrate (e.g., including doping or otherwise altered), may be formed over the substrate, or any combination thereof or have any other suitable configuration. In some embodiments, source/drain regions 160/161 and 162/163 may include any suitable materials and, optionally, any suitable dopants, depending on the end use or target application. For example, in some embodiments, the source/drain regions may include one or more III-V materials, such as InAs, InGaAs, InSb, InAsSb, or InGaSb, to name a few example materials. Further, in some such embodiments, the source/drain region material may include n-type dopants and/or p-type dopants, depending on the end use or target application. For example, in the case of an n-MOS device, the source/drain regions may both be n-type doped. In another example case of a tunnel FET (TFET) device, the source and drain regions may be oppositely typed doped (e.g., one n-type doped and the other p-type doped). Further yet, in some embodiments, the source/drain regions may include grading (e.g., increasing and/or decreasing) the content of one or more materials in at least one of the regions. Further still, in some embodiments, one or more of the layers included in the source/drain regions may be a multi-layer structure including at least two material layers, depending on the end use or target application. Once the source/drain regions are formed, a deposition of insulator material can be provided over the structure and planarized. A standard or custom source/drain contact formation process flow may proceed from there. In one example case, after forming the contact trenches in the insulator material and over the source/drain regions 160/161 and 162/163, a contact structure is provided therein, which in some example embodiments may include a resistance reducing metal and a contact plug metal, or just a contact plug. Example contact resistance reducing metals include silver, nickel, aluminum, titanium, gold, gold-germanium, nickel-platinum or nickel-aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, using conventional deposition processes. Other embodiments may further include additional layers, such as adhesion layers (e.g., titanium nitride) and/or liner or barrier layers (e.g., tantalum nitride), if so desired.

In the example structure of FIG. 3, the left transistor (including one nanowire channel region 126) may be a p-MOS device, in some embodiments, and source/drain regions 160/161 may both be doped with a p-type dopant. In another example embodiment, the right transistor (including two nanowire channel region 126') may be an n-MOS device, and source/drain regions 162/163 may both be doped with an n-type dopant. Further, in embodiments where one of the transistors is a p-MOS device and the other is an n-MOS device, they may both be included in a CMOS device, for example. Note that in such a CMOS device, the transistors may be located farther apart than what is shown in FIG. 3 and/or include additional isolation material between the two transistors, for example. Further note that the transistors in such a CMOS device configuration may not share the same gate stack, for example. In some embodiments, the techniques may be used to form an n-MOS device and such an n-MOS device may be combined with a p-MOS device (e.g., an Si, SiGe, or Ge p-MOS device) to form a CMOS device, for example. In some embodiments, any suitable source/drain material and optional doping schemes may be used, depending on the end use or target application. For example, in TFET configurations, the source/drain regions may be oppositely type doped (e.g., source is p-type doped and drain is n-type doped, or vice versa), with the channel region being minimally doped or undoped (or intrinsic/i-type). The two different configurations including different channel geometries are both provided in the example structure of FIG. 3 for ease of illustration. In some embodiments, a single integrated circuit may include transistors having all the same configuration (and optionally have varying n or p-type structures) or two or more different configurations (and optionally have varying n or p-type structures).

As can be understood based on the present disclosure, in some embodiments, a transistor (or other integrated circuit layers, structures, features, or devices) formed using the techniques described herein may be formed at least one of above and on the substrate 100, as various portions of the transistor (or other integrated circuit layers, structures, features, or devices) may be formed on the substrate (e.g., the source/drain regions 160/161 and 162/163), various portions may be formed above the substrate (e.g., nanowires 126 and 126'), and various portions may be considered to be both on and above the substrate, for example. Note that forming a layer/structure/feature/device on the substrate 100 as used herein is inclusive of forming that layer/structure/feature/device in the substrate 100 (e.g., where the feature is at least partially sandwiched between substrate 100 material), as the layer/structure/feature/device is also on the substrate. For example, in the structure of FIG. 3, the source/drain regions 160/161 and 162/163 are illustrated as at least partially in the substrate 100 (e.g., where the bottom faceted portion extends into the substrate 100 material), but the source/drain regions 160/161 and 162/163 are also on the substrate 100 (e.g., as the bottom surfaces of the regions are on the substrate 100 material).

Figure 4:
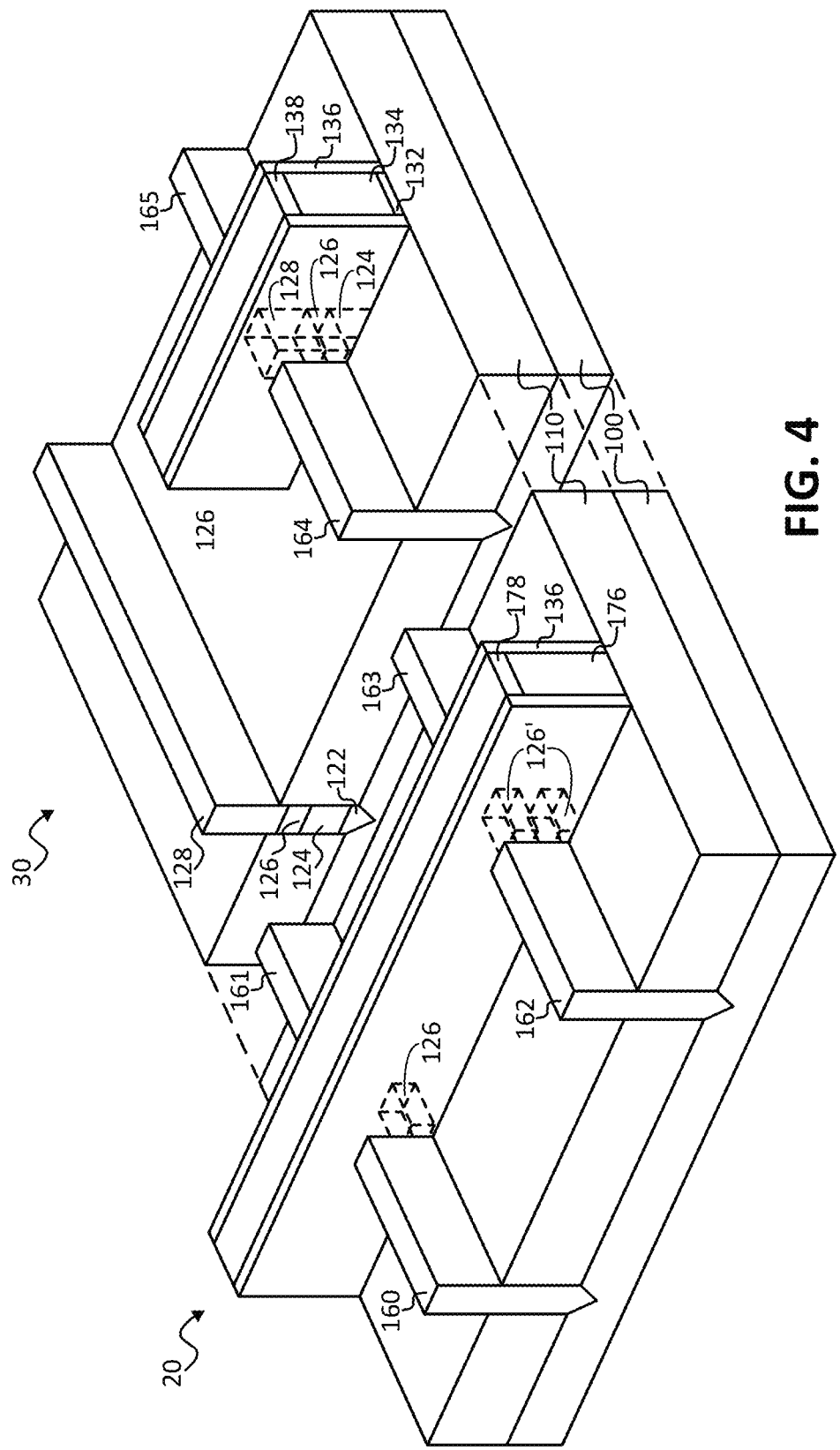
FIG. 4 illustrates the structure of FIG. 3 included on the same die as structures including the replacement material fin stack of FIG. 1E, in accordance with some embodiments of this disclosure.

FIG. 4 illustrates the structure 20 of FIG. 3 included on the same die as structures including the replacement material fin stack of FIG. 1E, in accordance with some embodiments. FIG. 4 is provided to illustrate that the GAA transistors formed using the techniques described herein may be detected based on dummy or unused structures remaining on the same die, as the group IV materials used to form the GAA transistor (e.g., layer 124 and optionally layers 122 and 128) are sacrificial, in some embodiments, and thus they may not be present in the final transistor structure, as can be understood based on this disclosure. Therefore, detection of the techniques and structures described herein may be achieved based on the structures remaining after various stages of the fabrication process. For example, the structure of FIG. 3, indicated as 20 and including the GAA transistors formed using the techniques described herein, may share the same substrate 100 (or more generally, the same base die or chip) with one or more dummy or unused structures, such as those illustrated in the example integrated circuit structure 30. As shown in example structure 30, the left fin may have been processed to the stage of the structure shown in FIG. 1E, such that the substrate 100 (or base die or chip) of the end product includes GAA transistors formed using the techniques described and also includes at least one dummy or unused fin structure including a III-V material layer (e.g., layer 126) and one or more group IV material layers (e.g., buffer layer 124, and optionally, nucleation layer 122 and/or cap layer 128) as described herein. Moreover, in some embodiments, various other structural remnants of the techniques described herein may be present on the same substrate 100 (or base die or chip). For example, the right side of structure 30 is provided to illustrate that the remnants of the process, including an unused fin structure as previously described, may be underneath a gate or dummy gate structure (e.g., including layers 132, 134, 136, and 138, as previously described), as shown. In such an example case, the fin portions on either side of the gate/dummy gate structure may also include the material stack illustrated on the left side of structure 30, or they may have been removed and replaced, such as is shown with replacement fins 164 and 165 (e.g., which may occur during source/drain processing, whether or not it was desired). Numerous variations and configurations will be apparent in light of this disclosure.

Example System

Figure 5:
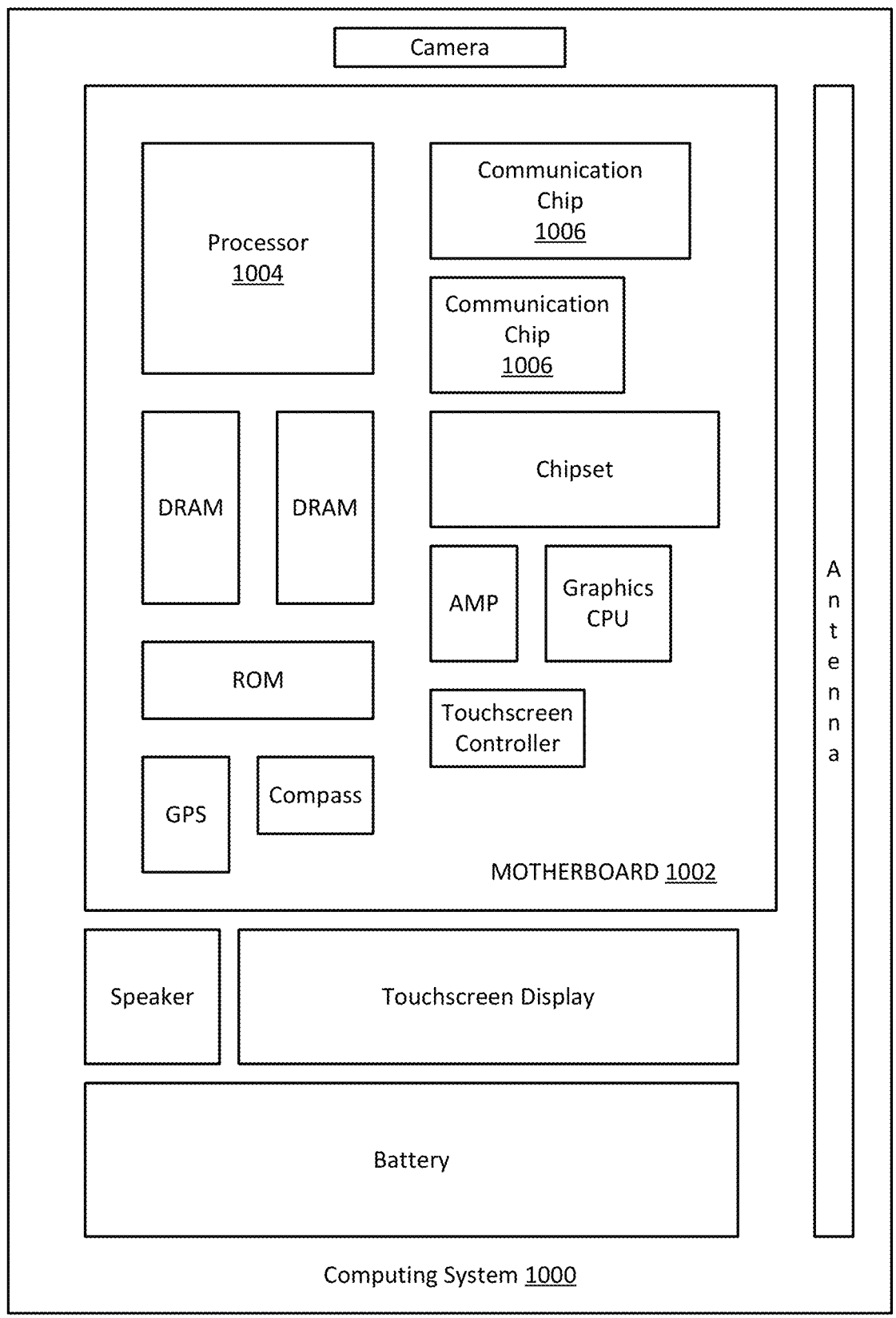
FIG. 5 illustrates a computing system implemented with integrated circuit structures or devices formed using the techniques disclosed herein, in accordance with some embodiments of this disclosure.

FIG. 5 illustrates a computing system 1000 implemented with integrated circuit structures or devices formed using the techniques disclosed herein, in accordance with some embodiments. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a substrate; and a transistor including: a channel formed above the substrate and including one or more nanowires, each nanowire including group III-V semiconductor material; and a gate stack substantially around each nanowire, the gate stack including gate dielectric material and gate electrode material; a trench-like feature located below the one or more nanowires and extending into a portion of the substrate, wherein gate dielectric material and gate electrode material are in the trench-like feature including the portion that extends into the substrate.

Example 2 includes the subject matter of Example 1, wherein the transistor channel includes at least two nanowires.

Example 3 includes the subject matter of any of Examples 1-2, wherein the trench-like feature includes a bottom portion including {111} faceting.

Example 4 includes the subject matter of any of Examples 1-3, wherein the gate being substantially around the at least one nanowire includes that the gate is around at least 90% of an outer surface of the at least one nanowire.

Example 5 includes the subject matter of any of Examples 1-4, wherein gate dielectric material is located between gate electrode material and each nanowire.

Example 6 includes the subject matter of any of Examples 1-5, wherein the group III-V material includes at least one of indium gallium arsenide, gallium arsenide, gallium nitride, indium gallium nitride, indium arsenide, indium arsenide antimonide, and indium antimonide.

Example 7 includes the subject matter of any of Examples 1-6, further including a fin formed at least one of above and on the substrate, the fin including a first layer including group III-V semiconductor material and a second layer including group IV semiconductor material, wherein the second layer is below the first layer.

Example 8 includes the subject matter of Example 7, wherein the fin further includes a cap layer including group IV semiconductor material and located above the first layer of the fin.

Example 9 includes the subject matter of Example 8, wherein the first layer and the cap layer include the same group IV material.

Example 10 includes the subject matter of any of Examples 7-9, wherein the group IV material includes one of silicon, germanium, and silicon germanium.

Example 11 includes the subject matter of any of Examples 1-10, further including source and drain regions adjacent to the transistor channel.

Example 12 includes the subject matter of any of Examples 1-11, wherein the transistor includes a gate-all-around configuration.

Example 13 includes the subject matter of any of Examples 1-12, wherein the transistor is an n-type transistor.

Example 14 includes the subject matter of any of Examples 1-13, wherein the transistor is one of a metal-oxide-semiconductor field-effect-transistor (MOSFET) and a tunnel field-effect-transistor (TFET).

Example 15 includes the subject matter of any of Examples 1-14, further including a complementary metal-oxide-semiconductor (CMOS) device including the transistor.

Example 16 includes the subject matter of any of Examples 1-14, further including a complementary tunnel field-effect-transistor (CTFET) device including the transistor.

Example 17 is a computing system including the subject matter of any of Examples 1-16.

Example 18 is an integrated circuit comprising: a substrate; a transistor formed at least one of above and on the substrate, the transistor comprising: a channel comprising one or more nanowires and including group III-V semiconductor material; source and drain regions adjacent to the channel; and a gate stack substantially around each nanowire, the gate stack including gate dielectric material and gate electrode material; and a fin formed at least one of above and on the substrate, the fin comprising a first layer including group III-V semiconductor material and a second layer including group IV semiconductor material, wherein the second layer is below the first layer.

Example 19 includes the subject matter of Example 18, wherein the group III-V material included in the at least one nanowire is the same as the group III-V material included in the first layer of the fin.

Example 20 includes the subject matter of any of Examples 18-19, wherein the group IV material layer includes different material than the substrate.

Example 21 includes the subject matter of any of Examples 18-20, wherein the fin further includes a cap layer including group IV semiconductor material and located above the first layer of the fin.

Example 22 includes the subject matter of any of Examples 18-21, further comprising a trench-like feature located below the one or more nanowires and extending into a portion of the substrate, wherein gate stack material is in the trench-like feature including the portion that extends into the substrate.

Example 23 includes the subject matter of Example 22, wherein the trench-like features comprises a bottom portion including {111} faceting.

Example 24 includes the subject matter of any of Examples 18-23, wherein the transistor channel includes at least two nanowires.

Example 25 includes the subject matter of any of Examples 18-24, wherein the gate being substantially around the at least one nanowire includes that the gate is around at least 80% of an outer surface of the at least one nanowire.

Example 26 includes the subject matter of any of Examples 18-25, wherein gate dielectric material is located between gate electrode material and each nanowire.

Example 27 includes the subject matter of any of Examples 18-26, wherein the group III-V material includes at least one of indium gallium arsenide, gallium arsenide, gallium nitride, indium gallium nitride, indium arsenide, indium arsenide antimonide, and indium antimonide.

Example 28 includes the subject matter of any of Examples 18-27, wherein the group IV material includes one of silicon, germanium, and silicon germanium.

Example 29 includes the subject matter of any of Examples 18-28, wherein the transistor includes a gate-all-around configuration.

Example 30 includes the subject matter of any of Examples 18-29, wherein the transistor is an n-type transistor.

Example 31 includes the subject matter of any of Examples 18-30, wherein the transistor is one of a metal-oxide-semiconductor field-effect-transistor (MOSFET) and a tunnel field-effect-transistor (TFET).

Example 32 includes the subject matter of any of Examples 18-31, further including a complementary metal-oxide-semiconductor (CMOS) device including the transistor.

Example 33 includes the subject matter of any of Examples 18-31, further including a complementary tunnel field-effect-transistor (CTFET) device including the transistor.

Example 34 is a computing system including the subject matter of any of Examples 18-33.

Example 35 is a method of forming an integrated circuit, the method comprising: forming a fin on a substrate; forming shallow trench isolation (STI) material on either side of the fin; removing at least a portion of the fin to form a fin trench; forming a replacement fin stack in the fin trench, the replacement fin stack comprising a first layer including group III-V semiconductor material and a second layer including group IV semiconductor material, wherein the second layer is below the first layer; recessing the STI material; and selectively etching the group IV material relative to the group III-V material to substantially remove the second layer.

Example 36 includes the subject matter of Example 35, wherein the fin is native to the substrate.

Example 37 includes the subject matter of any of Examples 35-36, further including forming a third layer in the replacement fin stack, the third layer including group IV semiconductor material and located above the first layer.

Example 38 includes the subject matter of Example 37, further including removing the third layer during the selective etch process.

Example 39 includes the subject matter of any of Examples 35-38, wherein selectively etching the group IV material relative to the group III-V material includes using an etchant that removes the group IV material at a rate of at least 5 times faster than removal of the III-V material.

Example 40 includes the subject matter of any of Examples 35-39, further including forming a gate stack substantially around the first layer, the gate stack including gate dielectric material and gate electrode material.

Example 41 includes the subject matter of Example 40, wherein forming the gate substantially around the first layer includes that the gate is formed around at least 90% of an outer surface of the first layer.

Example 42 includes the subject matter of any of Examples 35-41, further including forming a transistor including a gate-all-around configuration.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
   a substrate;
   a body above the substrate, the body including group III-V semiconductor material;
   a gate structure wrapped around the body, the gate structure including a gate electrode and a gate dielectric, the gate dielectric between the gate electrode and the body;
   an isolation region having a lower plane, the lower plane on the substrate; and
   a trench below the body, the trench extending through the lower plane of the isolation region and into the substrate, wherein material of the gate dielectric and the gate electrode are included in a portion of the trench that extends into the substrate, and wherein a lowermost section of the trench is below the lower plane of the isolation region.

2. The integrated circuit of claim 1, wherein the substrate is a bulk silicon substrate.

3. The integrated circuit of claim 1, wherein the trench comprises a bottom portion including {111} faceting.

4. The integrated circuit of claim 1, wherein the body has a vertical thickness below a critical thickness of the group III-V semiconductor material included in the body, wherein the critical thickness is a thickness beyond which dislocations are introduced in the group III-V semiconductor material.

5. The integrated circuit of claim 1, wherein the group III-V semiconductor material included in the body includes indium.

6. The integrated circuit of claim 1, wherein the group III-V semiconductor material included in the body includes at least one of indium gallium arsenide, gallium arsenide, gallium nitride, indium gallium nitride, indium arsenide, indium arsenide antimonide, or indium antimonide.

7. The integrated circuit of claim 1, further comprising a fin extending from the substrate, the fin comprising a first layer including the group III-V semiconductor material included in the body, and the fin further comprising a second layer including group IV semiconductor material, wherein the second layer is between the first layer and the substrate.

8. The integrated circuit of claim 7, wherein the fin further comprises a third layer including group IV semiconductor material, the first layer between the second and third layers.

9. The integrated circuit of claim 8, wherein the second and third layers include the same group IV semiconductor material.

10. The integrated circuit of claim 1, wherein the trench extends through the isolation region.

11. The integrated circuit of claim 1, wherein the isolation region has a smaller thickness between the gate structure and the substrate than between gate spacers and the substrate, the gate structure between the gate spacers.

12. The integrated circuit of claim 1, further comprising an additional body between the body and the substrate, the gate structure wrapped around the additional body.

13. The integrated circuit of claim 1, further comprising source and drain regions, the body between the source and drain regions, wherein the source and drain regions include semiconductor material and n-type dopant.

14. The integrated circuit of claim 1, further comprising a transistor that includes the body and the gate structure, wherein the transistor is one of a metal-oxide-semiconductor field-effect-transistor (MOSFET) and a tunnel field-effect-transistor (TFET).

15. The integrated circuit of claim 1, further comprising a complementary metal-oxide-semiconductor (CMOS) device including the body and the gate structure.

16. A computing system comprising the integrated circuit of claim 1.

17. An integrated circuit including at least one transistor, the integrated circuit comprising:
    a substrate;
    a body above the substrate, the body including group III-V semiconductor material;
    a gate structure wrapped around the body, the gate structure including a gate electrode and a gate dielectric, the gate dielectric between the gate electrode and the body;
    a fin extending from the substrate, the fin comprising a first layer including the group III-V semiconductor material included in the body, and the fin further comprising a second layer including group IV semiconductor material, wherein the second layer is between the first layer and the substrate;
    an isolation region having a lower plane, the lower plane on the substrate; and
    a first trench below the body and a second trench in which at least a portion of the fin resides, where both of the first and second trenches extend through the lower plane of the isolation region and into the substrate, wherein a lowermost section of each of the first and second trenches is below the lower plane of the isolation region.

18. The integrated circuit of claim 17, wherein material of the gate dielectric and the gate electrode are included in at least in a portion of the first trench, the portion of the first trench extending into the substrate.

19. The integrated circuit of claim 17, wherein the first and second trenches each have a bottom portion including {111} faceting.

20. The integrated circuit of claim 17, wherein the fin further comprises a third layer including group IV semiconductor material, the first layer between the second and third layers.

* * * * *